United States Patent [19]

Van Der Meulen

[11] Patent Number: 4,873,487

[45] Date of Patent: Oct. 10, 1989

[54] METHOD AND ARRANGEMENT FOR SUPPRESSING COHERENT INTERFERENCES IN MAGNETIC RESONANCE SIGNALS

[75] Inventor: Peter Van Der Meulen, Eindhoven, Netherlands

[73] Assignee: U.S. Philips Corp., NY, N.Y.

[21] Appl. No.: 54,476

[22] Filed: May 27, 1987

[30] Foreign Application Priority Data

Feb. 4, 1987 [NL] Netherlands .......................... 8700266

[51] Int. Cl.[4] ............................................ G01R 33/20
[52] U.S. Cl. .................................................... 324/314
[58] Field of Search ............... 324/307, 309, 312, 313, 324/314, 318

[56] References Cited

U.S. PATENT DOCUMENTS

| | | | |
|---|---|---|---|
| 3,968,424 | 7/1976 | Ernst | 324/312 |
| 4,070,611 | 1/1978 | Ernst | 324/309 |
| 4,191,919 | 3/1980 | Haney et al. | 324/312 |
| 4,318,043 | 3/1982 | Crooks et al. | 324/309 |
| 4,654,597 | 3/1987 | Hino | 324/314 |
| 4,673,880 | 6/1987 | Compton et al. | 324/309 |

OTHER PUBLICATIONS

Freeman, R., et al. "Phase and Intensity Anomalies in Fourier Transform NMR", J. of Magnetic Res., vol. 4, 1971.

Primary Examiner—Stewart J. Levy
Assistant Examiner—Kevin D. O'Shea
Attorney, Agent, or Firm—Thomas A. Briody; Jack E. Haken; Jack D. Slobod

[57] ABSTRACT

In NMR images, which are constructed from resonance signals, for example with Fourier zeugmatography, due to coherent interferences, for example, as a result of "leak-through" of NMR signals from one sequence to a next sequence of resonance signals, artefacts can occur in the images, which, depending upon the kind of interference, become manifest in the image as interference lines, ghost images or conspicuous dots. A method is disclosed of reducing the influence of these interferences by smearing the artefacts out over the image as noise. For this purpose, the phase of the reference signals is randomly modulated between measuring cycles of the resonance signals. The reference signal is used to form excitation pulses for producing resonance signals in a body and further in synchronous detection of the resonance signals.

5 Claims, 2 Drawing Sheets

METHOD AND ARRANGEMENT FOR SUPPRESSING COHERENT INTERFERENCES IN MAGNETIC RESONANCE SIGNALS

BACKGROUND OF THE INVENTION

1. Field of the Invention

The invention relates to a method of determining the nuclear magnetization distribution in a body from magnetic resonance signals which are excited in sequences in such body located in a stationary magnetic field, a sequence comprising at least one high-frequency electromagnetic pulse produced by means of a reference signal, which pulse excites a magnetic resonance signal in the body which is detected in the presence of the reference signal.

The invention further relates to an arrangement for determining a nuclear magnetization distribution in a part of a body, the arrangement comprising means for producing a stationary magnetic field, means for producing magnetic field gradients, means for producing a reference signal, transmitter apparatus for transmitting a high-frequency electromagnetic pulse formed in the transmitter apparatus by means of the reference signal, a receiver apparatus for receiving and detecting by means of the reference signal a resonance signal which is excited in the body by such pulse, and a processing apparatus for processing the detected resonance signals.

The term "nuclear magnetization distribution" is to be interpreted in a broad sense, so that inter alia, terms like "spin nuclei density distribution", "longitudinal relaxation time ($T_1$) distribution", "transversal relaxation time ($T_2$) distribution" and "nuclear magnetic resonance frequency spectrum distribution" (NMR position-dependent spectroscopy) are all to be understood to be included in the term "nuclear magnetization distribution".

2. Description of the Related Art

Such a method and such an arrangement are known from the article by Locher in "Philips Technical Review", Volume 41, 1983/84, No. 3. In such a method, a body to be examined is arranged in a stationary magnetic field $B_O$, whose direction coincides with the axis of a stationary Cartesian coordinate system. The magnetic field $B_O$ has the result that a small excess quantity of the spin nuclei present in the body has the same direction as the field $B_O$. The fact that there is only a small excess quantity with respect to the theoretically possible saturation value (all spins having the same direction) is due to thermal movement, as a result of which a large number of spin nuclei assume a direction opposite to the field. The small excess quantity is to be interpreted, considered macroscopically, as a magnetization M of the body or as a small polarization of the spin nuclei present in the body. After irradiation of the body arranged in the magnetic field by a high-frequency electromagnetic pulse, which should have a given frequency, the magnetization M is unbalanced and will perform a precession movement around the magnetic field $B_O$. When the precession movement is considered from a rotating Cartesian coordinate system (x, y, z) whose z axis coincides with the z axis of the said stationary Cartesian coordinate system, and when the angular velocity of the rotating Cartesian coordinate system is chosen to be equal to the angular frequency of the high-frequency electromagnetic pulse, the magnetization M is to be interpreted as a vector, which due to the irradiation moves in a plane at right angles to the direction of irradiation. The component of the magnetization M at right angles to the z axis, i.e. the so-called transversal magnetization, has the result that after irradiation a resonance signal is obtained. For the angular frequency of the high-frequency electromagnetic pulse, the relation $\omega_O = \gamma \cdot B_O$ must hold in order that the spin nuclei will perform a "Larmor" precession movement around the magnetic field M, where $\omega_O$ is the precession angular frequency (of protons if a spin nuclei density distribution of protons is desired), $\gamma$ is the gyromagnetic ratio (of the proton) and $B_O$ is the strength of the stationary magnetic field. The high-frequency electromagnetic pulses are formed in a transmitter apparatus in which the pulse is produced by modulation of a reference signal which is supplied b an oscillator and has a frequency (in the proximity of) $\omega_O$ with a low-frequency signal determining the pulse shape, after which the pulse is transmitted by the transmitter apparatus by means of a transmitter coil located near the body. The magnitude of the transversal magnetization is determined by the surface area below the pulse. A 90° pulse is concerned when the magnetization rotates through 90° with respect to the magnetic field $B_O$ through the pulse. The resonance signal produced by the high-frequency electromagnetic pulse can be detected with a receiver coil by means of a receiver apparatus with the aid of so-called double phase-sensitive detection, the reference signal and a signal obtained by shifting the phase of the reference signal through 90° being employed. It can be simply demonstrated that the detected resonance signal, except for a constant factor, represents the transversal magnetization. When resonance signals are produced in a given manner in sequences in the body, it is possible, for example, to reconstruct with the information obtained from the resonance signals a proton density distribution by processing means. For example, in general and also from the said article by Locher the so-called spin echo sequence is known for producing the resonance signals and the so-called "Fourier zeugmatography" is known for image formation from the resonance signals. For example, in order to obtain information about a local proton density in the body, it is necessary not only to irradiate the body by high-frequency electromagnetic pulses, but also to apply magnetic field gradients, whose field direction coincides with the magnetic field $B_O$. It is shown in the article by Locher that there is a direct relation between a frequency in the resonance signal and a local proton density (position). By the application of a magnetic field gradient at the magnetic field $B_O$ having a given gradient direction, a resonance signal is obtained whose spectrum (Fourier transformation of the resonance signal) is, for example, the image of the proton density in the gradient direction. Bidimensional Fourier zeugmatography utilizes this phenomenon. Two gradients are applied for encoding the position-dependent proton density in the body, a so-called preparation gradient, whose gradient direction coincides with the y axis of, for example, a stationary Cartesian coordinate system (x, y, z), assuming in each sequence a different value and the so-called measurement gradient, whose gradient direction coincides with the x axis, having the same course for each sequence. In cooperation with high-frequency electromagnetic pulses (mostly selectively, i.e. with another magnetic field gradient, whose direction coincides with the z axis, only spin nuclei are selected in a layer at right angles to the z axis), resonance signals are obtained, which after sampling thereof yield sample values. After bidimensional (discrete) Fourier transformation (for example "Fast Fourier transformation") in the processing apparatus, image elements are obtained from the sample values formed and these image elements together constitute an image, in this case a proton density of a slice of the body. By a suitable choice of magnetic field gradients and high-frequency electromagnetic pulses, tridimensional proton density distributions of frequency spectra per image element (from which an interpretation of the metabolic state of the image element can be given) can be obtained.

Due to different causes, in an image obtained by, for example, Fourier zeugmatography, unwanted components occur in the resonance signals which become manifest in the image as interference lines and/or ghost images. The usual NMR equipment has the disadvantage that stringent requirements must be imposed thereon; for example, 180° pulses should have a high degree of perfection and phase shifts between sequences should be optimum in order to prevent that a resonance signal formed in a sequence does not "leak through" to a following sequence in which the next resonance signal is produced. Coherent interferences are concerned here. Other interference sources also give rise to coherent interferences. Interference sources are inter alia: cross-talk in the high-frequency electronic circuits of transmitter and receiver, coherence between the reference signal and the clock of analog-to-digital converters in the processing means, periodical variations in the gradient strengths, mechanical oscillations of the NMR system.

It should noted that it is known from U.S. Pat. No. 3,968,424 to influence spectra by means of a magnetic resonance arrangement employing high-frequency electromagnetic pulses. The arrangement described in such patent is designed to determine NMR spectra of a sample to be analyzed. For this purpose, pulse trains of high-frequency electromagnetic pulses are produced, while unequal phases can be given to successive pulses. FID signals originating from many successive pulses are averaged in time and a spectrum of the sample is determined from the resulting signal by means of a Fourier transformation. However, no mention is made in such patent of image formation by Fourier transformation of resonance signals which are produced in a number of successive sequences, or of coherent interferences occuring between the sequences which give rise to image artefacts, such as interference lines, phantom images or conspicuous dots in an image. In such patent the object is to avoid artefacts in spectra which are caused by too rapid a succession of pulses. Smearing-out of image artefacts over an image is not achieved.

SUMMARY OF THE INVENTION

The invention has for its object to considerably reduce the effect of coherent interferences, and so permit use of NMR equipment meeting much less stringent requirements that would have to be imposed on NMR equipment in which the invention is not used.

A method according to the invention is characterized in that for smearing out artefacts due to coherent interference in the NMR sequences, between the successive sequences the phase of the reference signal is varied in value.

A preferred embodiment of a method according to the invention is characterized by random the variation of the value of the reference signal.

Thus, it is achieved that the artefacts, such as interference lines, ghost images or conspicuous dots, caused by the coherent interferences in the image are smeared out over the image as noise having a considerably lower intensity than the intensity of the artefact. It is necessary of course that the additional noise contribution to the image thus produced must not be large. The invention is based on the recognition of the fact that the phase of the resonance signal is solely determined by the phase relation of the high-frequency electromagnetic pulses with respect to the reference signal after excitation (rotation of the magnetization vector) and does not depend upon the phase of the reference signal before such excitation. The phase of the reference signal may therefore be varied between the sequences without disturbing a phase encoding provided by the preparation gradient in the resonance signal. The phase of interference signals whose during detection of the resonance signal does, however, depend upon the phase of the reference signal before excitation. Therefore, such signals will not be coherent with the resonance signals over a large number of sequences, and so interference signals can be discriminated with respect to the resonance signals. Interferences which would otherwise manifest in the image as ghost images or interference lines are smeared out as noise, while interference which otherwise would be manifest in the image as conspicuous dots are smeared out to a line having a considerably lower intensity.

An embodiment of a method according to the invention is characterized in that the variation in value is systematic. When, for example, the phase between the sequences is increased by a fixed amount, this will result in that the artefacts are smeared out in the image as noise.

An arrangement according to the invention is characterized in that the arrangement comprises means for varying the value of the phase of the reference signal before the transmission of the at least one high-frequency electromagnetic pulse. With such an arrangement the method according to the invention can be carried out, as a result of which artefacts are smeared out as noise as described above.

BRIEF DESCRIPTION OF THE DRAWINGS

The invention will further be described with reference to an embodiment shown in the drawings, in which.

DESCRIPTION OF THE PREFERRED EMBODIMENTS

Figure 1:
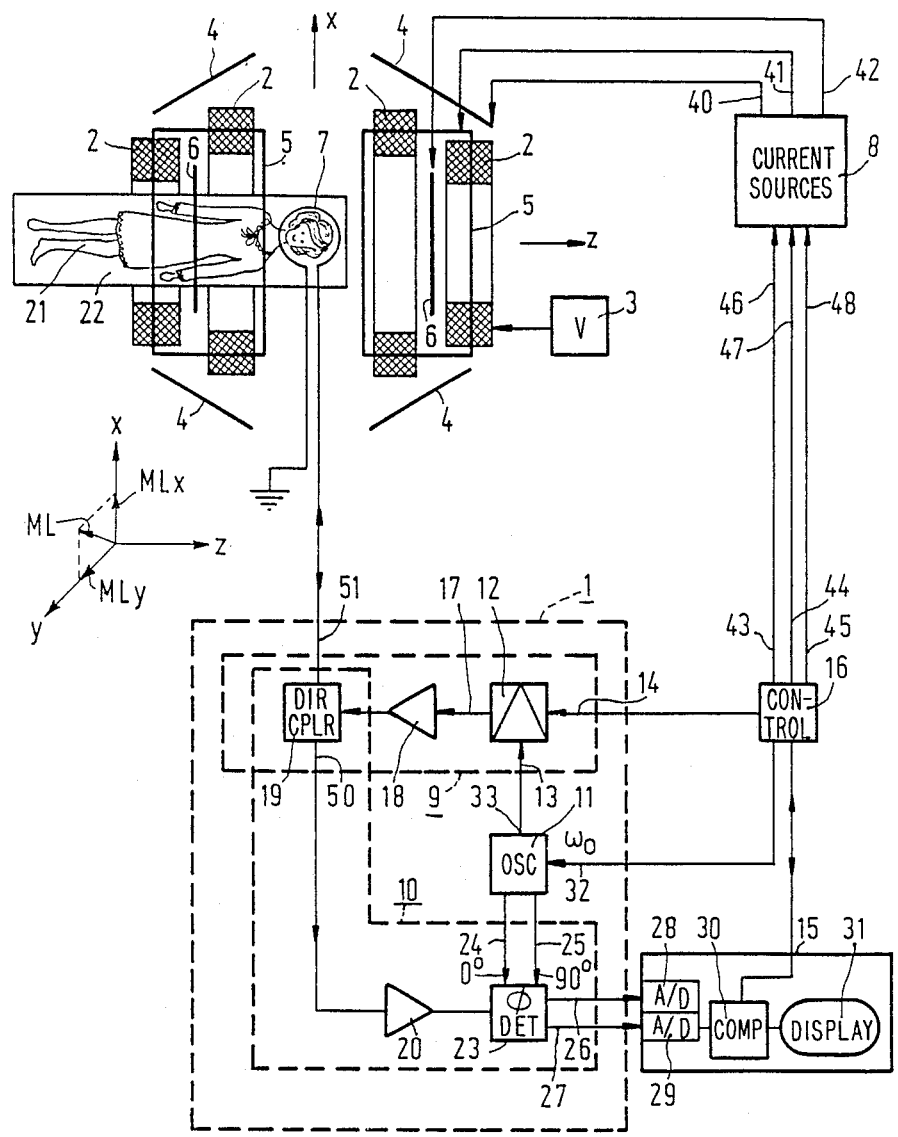
FIG. 1 shows diagrammatically an NMR arrangement comprising a transmitter and a receiver apparatus for carrying out the method according to the invention.

FIG. 1 shows diagrammatically an NMR arrangement comprising a transmitter and a receiver apparatus 1, this NMR arrangement further comprising magnet coils 2 fed by a direct voltage supply source 3 for producing a stationary magnetic field $B_O$, gradient coils 4 for producing a magnetic field gradient $G_x$, gradient magnet coils 5 for producing a magnetic field gradient $G_y$, gradient magnet coils 6 for producing a magnetic field gradient $G_z$ and a transmitter and receiver coil 7. In the embodiment shown, the arrangement of the coils is such that the field direction of the magnetic field gradients $G_x$, $G_y$ and $G_z$ coincides with the direction of the magnetic field $B_O$ and that the gradient directions are at right angles to each other. Furthermore, a transmitter coil and receiver coil required for an NMR arrangement are constructed as the transmitter and receiver coil 7, which should not be considered as a limitation; transmitter coils and receiver coils, which may be combined with each other, are available in a large number of variations. The NMR arrangement further comprises a current sources 8 for feeding the gradient coils. The current sources 8 for this purpose comprises outputs 40, 41, 42. The transmitter and receiver apparatus 1 comprises a transmitter device 9 and a receiver device 10 and further an oscillator 11 for producing a reference signal. The transmitter device 9 comprises a modulator 12 for forming a high-frequency electromagnetic pulse, this modulator 12 having a first input 13 for supplying the reference signal and further a second input 14 for supplying a pulse-forming low-frequency signal to be produced by a processing device 15 and a control unit 16. The modulator 12 is coupled by an output 17 to a power amplifier 18, which is coupled to a directional coupler 19. The directional coupler 19 comprises an input/output 51, which is coupled to the transmitter and receiver coil 7. The receiver device 10 comprises a preamplifier 20 for supplying a resonance signal to be produced via an output 50 of the directional coupler 19 with the transmitter coil 7 in a body 21 to be introduced via a patient table 22 into the NMR arrangement and further comprises a double phase-sensitive detector 23 coupled to the preamplifier 20 for demodulation of a resonance signal modulated with the reference signal. The double phase-sensitive detector 23 comprises a first input 24 for supplying the resonance signal to be produced by the oscillator 11 and a second input 25 for supplying a signal to be produced by means of the oscillator 11, this signal being formed from the reference signal by shifting the phase of the reference signal through 90°. The double phase-sensitive detector 23 is adapted to form a first and a second modulated signal from the modulated resonance signal to be supplied by the preamplifier 20 to the double phase-sensitive detector 23 at outputs 26, 27 of the double phase-sensitive detector 23, the first demodulated signal at the output 26 representing a component MLx of a transversal magnetization vector ML (in a rotating coordinate system rotating with the frequency of the oscillator 11) decomposed along an x axis and the second demodulated signal at the output 27 representing a component MLy of the transversal magnetization vector ML decomposed along a y axis. The outputs 26, 27 of the double phase-sensitive detector 23 are coupled to analog-to-digital converters 28 and 29, respectively, in the processing device 15. The processing device 15 comprises programmed computer means 30 for reconstructing a nuclear magnetization distribution from demodulated resonance signals sampled via the analog-to-digital converters 28, 29. A display screen 31 coupled to the programmed computer means 30 is intended inter alia to display the nuclear magnetization distribution to be represented, for example via intensity differences, on the display screen 31. The control unit 16 is coupled to the processing device 15. Furthermore, the control unit 16 is coupled to the input 32 of the oscillator 11. Via the programmed computer means 30 and the control unit 16, the frequency of the oscillator 11 can be modified. When a frequency modified with respect to a frequency $\omega_O$ is maintained for a given time and this frequency is then reset to the frequency $\omega_O$ of the oscillator 11, a phase jump can be obtained in the signal to be produced at the output 33 of the oscillator 11. Furthermore, the control unit 16 is coupled via outputs 43, 44, 45 to inputs 46,46,47,48 for driving the current sources 8.

Figure 2:
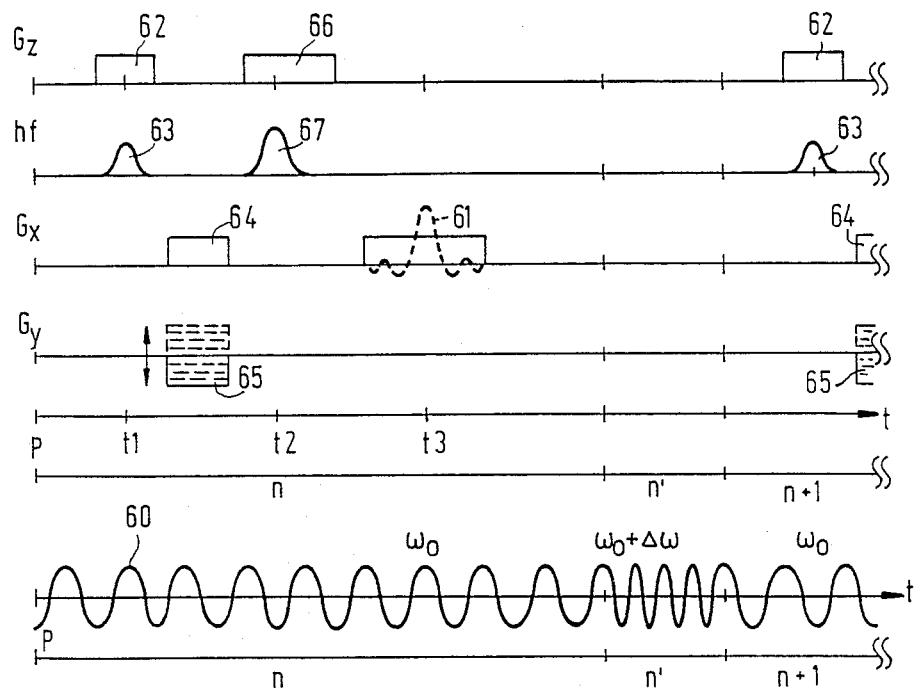
FIG. 2 shows spin echo sequences producing resonance signals, together with phase variation of the reference signal between the sequences.

In FIG. 2, spin echo cycles are shown for producing resonance signals, the phase of a reference signal 60 obtained by the oscillator 11 being modified between a sequence n and a sequence n+1 in the time interval n'. The frequency of the reference signal 60 is not drawn to scale with respect to the sequences n and n+1 and to the time interval n'for the sake of clarity. By way of example, the spin echo sequence n shown for producing a resonance signal 61 will be described, after which there is indicated how a phase variation between the sequences n and n−1 is obtained. With an NMR arrangement described with reference to FIG. 1 a method of determining a nuclear magnetization from magnetic resonance signals 61 produced in sequences in a body 21 is carried out. The method comprising the repetition of a spin echo sequence (or any other pulse gradient sequence), the sequence being repeated so frequently that a sufficient quantity of information is collected by means of resonance signals 61 about, for example, (a part of) the body 21 so that, for example, a spin nuclei density distribution may be reconstructed therefrom by the programmed computer means 30 in the processing device 15. For this purpose, in the embodiment shown, a number of spin nuclei are resonantly selectively excited in the body 21 in a number of cycles by exciting in the presence of a magnetic field gradient 62 in the z direction $G_z$, which is produced from the control unit 16 driven by the programmed computer means 30, the spin nuclei with a high-frequency electromagnetic pulse 63 (having a given band width around the frequency $\omega_O$ of the oscillator 11) produced by the transmitter device at the instant $t_1$ and also from the control unit 16 driven by the programmed computer means, which pulse is, for example, a so-called 90° pulse, that is to say that a pulse rotates through a magnetization vector M (not shown) in a plane at right angles to the z axis. The spin nuclei rotated (selectively) at right angles to the z axis will perform a precession movement around the magnetic field $B_O$, but will be shifted in phase (lose their coherence) between the instants $t_1$ and $t_2$. After excitation with the high-frequency electromagnetic pulse 63, the magnetic field gradients $G_x$ and $G_y$, 64, 65, are activated for encoding the resonance signal 62. $G_x$ is then fixed and $G_y$, the so-called preparation gradient, assumes a different value for each sequence. Subsequently, $G_z$ is activated again (66) and the body 21 is (selectively) excited with a 180° pulse (67). Due to the fact that the excited spin nuclei are brought into phase again, after the instant $t_2$, the resonance signal 61 will occur (echo) around the instant $t_3$, which resonance signal 61 is sampled after demodulation by the double phase-sensitive detector 23 by the analog-to-digital converters 28, 29, which are driven via the programmed computer means 30. Subsequently, the frequency of the oscillator 11 is varied in the period n' by the control unit 16, which is driven from the programmed computer means 30, as a result of which a phase shift is obtained in the resonance signal produced by the oscillator 11. When either the duration of the period n' or the frequency sweep $\Delta\omega$ is varied from the programmed computer means 30, the extent of the phase shift can be influenced. Subsequently, a next sequence n+1 is started and the pulse/gradient sequence described for the period n is repeated. The programmed computer means 30 reconstruct from sampled values (not shown) obtained by a large number of resonance signals 61 the spin nuclei density distribution with, for example, a bidimensional discrete Fourier transformation (in the embodiment shown, two dimensions are obtained: by variation of the preparation gradient and by sampling): this is a generally known method of reconstructing images from sampled values, in NMR. (FFT Fast Fourier Transform is known algorithm in this context). Preferably, in the method described, the value of the phase of the reference signal 60 is varied randomly, as a result of which coherent interferences, which become manifest, for example, as interference lines in an image without the use of the method, are smeared out as noise in the image with the use of the method. The class of interferences reduced by the method according to the invention comprises NMR signals, which "leak through" from one sequence to a next sequence, for example from the sequence n to the sequence n+. This may be due, for example, to pulse imperfections or nonoptimal phase shifts (after echo 61, all the excited spin nuclei should return after a waiting time to a state of equilibrium in the direction of $B_O$. Ordinarily, one does not waited until all the spin nuclei have returned to the state of equilibrium. Spin nuclei which have not returned to the state of equilibrium and have not correctly shifted in phase can in a next cycle provide a contribution to the resonance signal 61). With coherence over several sequences, these interferences become manifest as interference lines or ghost images in the reconstructed image. Thus, coherent interferences may be obtained by cross-talk in the transmitter and receiver apparatus 1. If, for example, there is coherence between the reference signal and the drive of the analog-to-digital converters 28, 29, interferences occur, which become manifest in the reconstructed image as conspicuous dots. The method according to the invention smears these conspicuous dots out to a line having a considerably lower intensity. Furthermore, coherent interferences are reduced which are obtained, for example, by hum from the current sources 8 for the gradient coils 4, 5, 6, and also coherent interferences obtained by mechanical oscillations in the NMR arrangement (for example typically having a frequency of 8 Hz; for example vibrations in the floor or vibrations in the patient table 22). The last-mentioned interferences yield without the method according to the invention outlines phantom images.

The invention is not limited to the embodiment shown, but many variations are possible for those skilled in the art within the scope of the invention. For example, many different pulse/gradient sequences may be used and many methods are possible of carrying out the scheme of the phase variation.

What is claimed is:

1. A method of determining a nuclear magnetization spatial distribution from magnetic resonance signals which are produced in sequences in a body located in a stationary magnetic field, a sequence comprising at least one high-frequency electromagnetic pulse which is produced by means of a reference signal, after which the magnetic resonance signal produced is detected in the presence of the reference signal and the nuclear magnetization spatial distribution is determined from the detected resonance signals by means of a Fourier transformation; characterized in that for smearing out over the determined spatial distribution, artefacts due to coherent interferences, the value of the phase of the reference signal is varied from one sequence to the next sequence.

2. A method as claimed in claim 1, characterized in that the variation in value is random.

3. A method as claimed in claim 1, characterized in that the variation in value is systematic.

4. A method as claimed in claim 1, 2 or 3, characterized in that the phase of the reference signal is varied from one sequence to the next by giving the reference signal a predetermined frequency sweep for a predetermined period of time.

5. An arrangement for determining a nuclear magnetization spatial distribution in a part of a body, this arrangement comprising means for producing a stationary magnetic field, means for producing magnetic field gradients and means for producing a reference signal, as well as transmitter means for transmitting a high-frequency electromagnetic pulse which is formed in the transmitter means by means of the reference signal, and receiver means for receiving and detecting by means of the reference signal a resonance signal which is excited in the body by at least one high-frequency electromagnetic pulse, and processing means for processing the detected resonance signals by means of a Fourier transformation, characterized in that for smearing out over the determined spatial distribution, artefacts due to coherent interferences, the arrangement comprises means for varying the value of the phase of the reference signal before the transmission of the at least one high-frequency electromagnetic pulse.

* * * * *